(12) United States Patent
Song et al.

(10) Patent No.: US 10,365,333 B2
(45) Date of Patent: Jul. 30, 2019

(54) TRANSFORMATION RELAY AND BATTERY VOLTAGE MEASUREMENT SYSTEM USING SAME

(71) Applicant: LG CHEM, LTD., Seoul (KR)

(72) Inventors: Hyeon Jin Song, Daejeon (KR); Yanglim Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/548,872

(22) PCT Filed: Dec. 28, 2015

(86) PCT No.: PCT/KR2015/014359
§ 371 (c)(1),
(2) Date: Aug. 4, 2017

(87) PCT Pub. No.: WO2016/204364
PCT Pub. Date: Dec. 22, 2016

(65) Prior Publication Data
US 2018/0031636 A1 Feb. 1, 2018

(30) Foreign Application Priority Data
Jun. 16, 2015 (KR) .................. 10-2015-0085311

(51) Int. Cl.
*B60L 58/10* (2019.01)
*G01R 31/3835* (2019.01)
(Continued)

(52) U.S. Cl.
CPC ....... *G01R 31/3835* (2019.01); *G01R 19/165* (2013.01); *G01R 19/16509* (2013.01);
(Continued)

(58) Field of Classification Search
CPC ............ G01R 31/362; G01R 19/16542; G01R 19/16509; G01R 19/16519; G01R 31/36;
(Continued)

(56) References Cited

U.S. PATENT DOCUMENTS 4,511,815 A 4/1985 Wood
4,967,101 A 10/1990 Nakamura et al.
(Continued)

FOREIGN PATENT DOCUMENTS

CN 101266266 A 9/2008
CN 201886132 U 6/2011
(Continued)

OTHER PUBLICATIONS

"Transformer-Isolated Gate Driver Provides very large duty cycle ratios," AN-950 (v.Int), Oct. 27, 2004.
(Continued)

*Primary Examiner* — Farhana A Hoque
(74) *Attorney, Agent, or Firm* — Birch, Stewart, Kolasch & Birch, LLP

(57) ABSTRACT

The present invention relates to a transformer relay and a battery voltage measurement system using the same and the transformer relay includes: a transformer transforming voltage of a voltage measurement signal according to a wiring ratio of a first wiring and a second wiring; and a relay transferring voltage of a battery while an operation state is changed to an On state when the transformed voltage of the voltage measurement signal is input and the battery voltage measurement system using the transformer relay, includes: the transformer; and a measurement unit measuring a battery voltage value by receiving the voltage of the battery from the relay.

6 Claims, 2 Drawing Sheets

(51) Int. Cl.
*G01R 31/36* (2019.01)
*G01R 19/165* (2006.01)
*H01H 47/00* (2006.01)
*H03K 17/691* (2006.01)

(52) U.S. Cl.
CPC . *G01R 19/16519* (2013.01); *G01R 19/16542* (2013.01); *G01R 31/36* (2013.01); *B60L 58/10* (2019.02); *H01H 47/007* (2013.01); *H03K 17/691* (2013.01); *Y02T 10/705* (2013.01)

(58) Field of Classification Search
CPC .. G01R 19/165; Y02T 10/705; H03K 17/691; H01H 47/007; B60L 11/1851
USPC .................................................. 324/426, 434
See application file for complete search history.

(56) References Cited

U.S. PATENT DOCUMENTS

| | | | |
|---|---|---|---|
| 5,646,534 A * | 7/1997 | Kopera | G01R 31/3648 324/434 |
| 5,712,568 A | 1/1998 | Flohr et al. | |
| 6,278,279 B1 * | 8/2001 | Daun-Lindberg | G01R 31/40 324/427 |
| 7,570,021 B2 | 8/2009 | Togashi et al. | |
| 8,148,949 B2 | 4/2012 | Oliveira et al. | |
| 9,766,296 B2 | 9/2017 | Lee | |
| 2008/0231257 A1 | 9/2008 | Williams | |
| 2013/0307551 A1 | 11/2013 | Makino | |
| 2014/0321167 A1 | 10/2014 | Klein | |

FOREIGN PATENT DOCUMENTS

| | | |
|---|---|---|
| DE | 43 27 665 A1 | 2/1995 |
| DE | 195 24 755 A1 | 1/1997 |
| JP | 5-322939 A | 12/1993 |
| JP | 2008-2983 A | 1/2008 |
| JP | 2014-150654 A | 8/2014 |
| KR | 10-2005-0061623 A | 6/2005 |
| KR | 10-0636550 B1 | 10/2006 |
| KR | 10-2011-0121618 A | 11/2011 |
| KR | 10-2015-0062708 A | 6/2015 |
| WO | WO 2005/111644 A1 | 11/2005 |

OTHER PUBLICATIONS

European Search Report for Appl. No. 15895751.4 dated Feb. 12, 2018.
Pulse, A Technitrol Company, "MOSFET Gate Drive Transformers," Dec. 31, 2005, P507.B.
International Search Report for PCT/KR2015/014359 (PCT/ISA/210) dated Apr. 12, 2016.

* cited by examiner

[Figure 1]
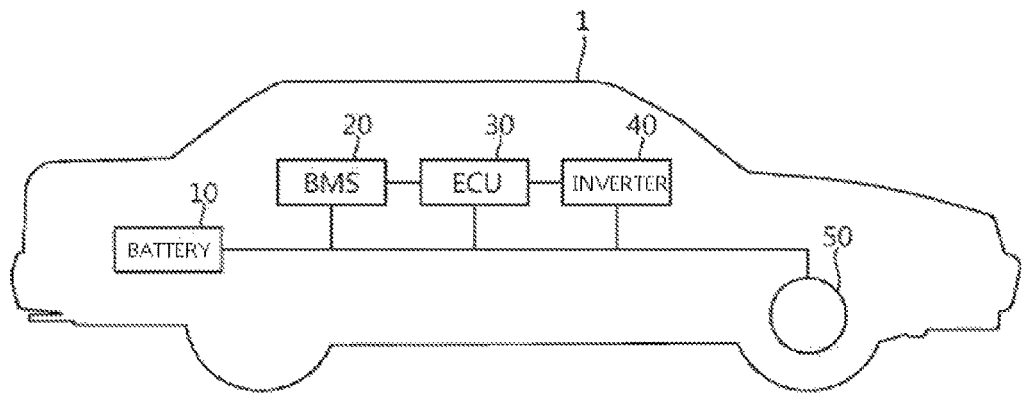
[Figure 2]
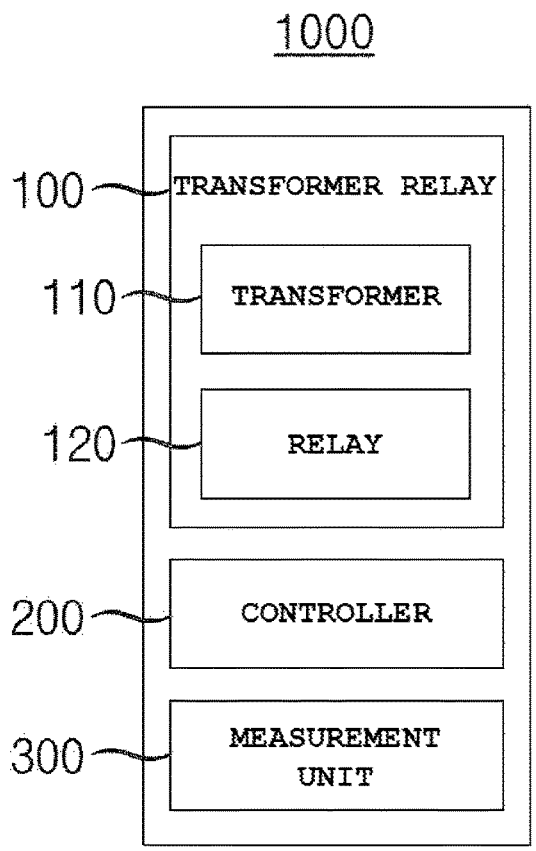

[Figure 3]
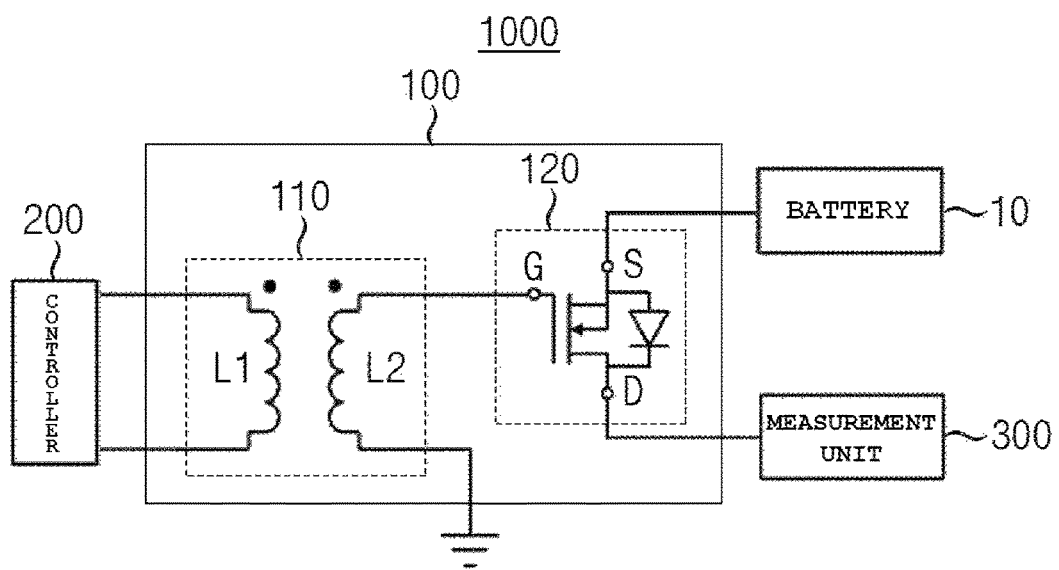

TRANSFORMATION RELAY AND BATTERY VOLTAGE MEASUREMENT SYSTEM USING SAME

TECHNICAL FIELD

This application claims priority to and the benefit of Korean Patent Application No. 10-2015-0085311 filed in the Korean Intellectual Property Office on Jun. 16, 2015, the entire contents of which are incorporated herein by reference.

The present invention relates to a transformer relay and a battery voltage measurement system using the same, and more particularly, to a transformer relay and a battery voltage measurement system using the same, which transform voltage of a voltage measurement signal transmitted from a controller by using a transformer and measure voltage of a battery by conducting a relay by inputting the voltage of a transformed voltage measurement signal in a measurement unit measuring the voltage of the battery and the relay that conducts or cuts off electrical connection of the battery.

BACKGROUND ART

In recent years, due to the depletion of fossil energy and environmental pollution caused by the use of the fossil energy, an interest in electric products that can be driven by secondary battery batteries is increasing. Accordingly, as the technology development and demand for a mobile device, an electric vehicle (EV), a hybrid electric vehicle (HEV), a plug-in hybrid electric vehicle (PHEV), an energy storage system (ESS) an uninterruptible power supply (UPS) and the like increase, the demand of the secondary battery as an energy source is rapidly increasing.

The secondary battery has received public attention as a new energy source for promoting eco-friendly performance and energy efficiency in that byproducts are not generated at all according to the use of the energy as well as a primary advantage of dramatically reducing the use of the fossil energy.

In particular, the secondary batteries used in the electric vehicle, the hybrid vehicle, the energy storage system, and the uninterruptible power supply require characteristics of a high output and a large capacity and in order to maintain the characteristics, it is important to frequently measure and monitor voltages of the secondary batteries.

As a result, in the related art, a photo-MOS relay is connected between the secondary battery and a measurement unit and the voltage of the secondary battery is measured by controlling an operation state of the photo-MOS relay to an On state at the time when measuring the voltage of the secondary battery is required, but since a life-span of an internal light emitting diode (LED) is short, an available period of the photo-MOS relay is short and it is difficult to miniaturize the photo-MOS relay.

Therefore, the present inventor has invented a transformer relay and a battery voltage measurement system using the same, which transform voltage a voltage measurement signal transmitted from a controller by using a transformer and measure voltage of a battery by conducting a relay by inputting the voltage of a transformed voltage measurement signal in a measurement unit measuring the voltage of the battery and the relay that conducts or cuts off electrical connection of the battery in order to solve the problem.

DETAILED DESCRIPTION OF THE INVENTION

Technical Problem

An object of the present invention is to provide a transformer relay and a battery voltage measurement system using the same, which transform voltage a voltage measurement signal transmitted from a controller by using a transformer and measure voltage of a battery by conducting a relay by inputting the voltage of a transformed voltage measurement signal in a measurement unit measuring the voltage of the battery and the relay that conducts or cuts off electrical connection of the battery.

Technical Solution

A battery voltage measurement system using a transformer relay according to the present invention is configured to include: a transformer transforming voltage of a voltage measurement signal according to a wiring ratio of a first wiring and a second wiring; a relay transferring voltage of a battery while an operation state is changed to an On state when the transformed voltage of the voltage measurement signal is input; and a measurement unit measuring a battery voltage value by receiving the voltage of the battery from the relay.

The battery voltage measurement system using a transformer relay may further include a controller transmitting the voltage measurement signal for measuring the voltage of the battery to a primary side of the transformer at a predetermined time.

The relay may be a metal oxide silicon field effect transistor (MOSFET) including a gate terminal, a source terminal, and a drain terminal.

A secondary side of the transformer may be connected to the gate terminal to input the transformed voltage of the voltage measurement signal, the battery may be connected to the source terminal to input the voltage of the battery, and the measurement unit may be connected to the drain terminal to output the voltage of the battery input in the source terminal to the measurement unit.

The wiring ratio may be 1:1.

A transformer relay according to the present invention is configured to include: a transformer transforming voltage of a voltage measurement signal according to a wiring ratio of a first wiring and a second wiring; and a relay transferring voltage of a battery while an operation state is changed to an On state when the transformed voltage of the voltage measurement signal is input.

The transformer may receive the voltage measurement signal for measuring the voltage of the battery through the primary side thereof at a predetermined time.

The relay may be a metal oxide silicon field effect transistor (MOSFET) including a gate terminal, a source terminal, and a drain terminal.

A secondary side of the transformer may be connected to the gate terminal to input the transformed voltage of the voltage measurement signal, the battery may be connected to the source terminal to input the voltage of the battery, and a measurement unit measuring a battery voltage value may be connected to the drain terminal to output the voltage of the battery input in the source terminal to the measurement unit.

The wiring ratio may be 1:1.

Advantageous Effects

A transformer relay and a battery voltage measurement system using the same according to the present invention transform voltage of a voltage measurement signal transmitted from a controller by using a transformer and measure voltage of a battery by conducting a relay by inputting the voltage of a transformed voltage measurement signal in a measurement unit measuring the voltage of the battery and the relay that conducts or cuts off electrical connection of the battery to measure the voltage of the battery without a limit in life-span and maintain insulation of a high-voltage battery and a controller.

BRIEF DESCRIPTION OF DRAWINGS

FIG. 1 is a diagram schematically illustrating an electric vehicle to which a battery voltage measurement system using a transformer relay may be applied according to an embodiment of the present invention.

FIG. 2 is a block diagram illustrating a configuration of the battery voltage measurement system using the transformer relay according to the embodiment of the present invention.

FIG. 3 is a diagram illustrating one example of a detailed configuration of the battery voltage measurement system using the transformer relay according to the embodiment of the present invention.

BEST MODE

The present invention will be described below in detail with reference to the accompanying drawings. Herein, the repeated description and the detailed description of known function and configuration that may make the gist of the present invention unnecessarily ambiguous will be omitted. Embodiments of the present invention will be provided for more completely describing the present invention to those skilled in the art. Accordingly, shapes, sizes, and the like of elements in the drawings may be exaggerated for clearer explanation.

Throughout the specification, unless explicitly described to the contrary, the word "comprise" and variations such as "comprises" or "comprising", will be understood to imply the inclusion of stated elements but not the exclusion of any other elements.

In addition, the term "unit" disclosed in the specification means a unit that processes at least one function or operation and this may be implemented by hardware or software or a combination of hardware and software.

FIG. 1 is a diagram schematically illustrating an electric vehicle to which a battery voltage measurement system using a transformer relay may be applied according to an embodiment of the present invention.

In FIG. 1, an example in which a battery voltage measurement system 1000 (of FIGS. 2 and 3) using a transformer relay according to an embodiment of the present invention is applied to an electric vehicle 1 is illustrated, but the battery voltage measurement system 1000 using the transformer relay according to the embodiment of the present invention may be applied to even all technical fields to which a secondary battery such as a mobile device, an energy storage system (ESS), or an uninterruptible power supply (UPS) may be applied in addition to the electric vehicle 1.

The electric vehicle 1 may be configured to include a battery 10, a battery management system (BMS) 20, an electronic controller (ECU) 30, an inverter 40, and a motor 50.

The battery 10 is an electric energy source that drives the electric vehicle 1 by providing driving force to the motor 50. The battery 10 may be charged or discharged by the inverter 40 by driving the motor 50 or an internal combustion engine (not illustrated).

Herein, a type of battery 10 is not particularly limited and the battery may be constituted by, for example, a lithium ion battery, a lithium polymer battery, a nickel cadmium battery, a nickel hydrogen battery, a nickel zinc battery, and the like.

The BMS 20 estimates the state of the battery 10 and manages the battery 10 by using estimated state information. For example, the BMS estimates and manages state information of the battery 10, which includes a state of charging (SOC), a state of health (SOH), a maximum input/output power allowance amount, output voltage, and the like of the battery 10. In addition, the BMS 20 may control charging or discharging of the battery 10 by using the state information and furthermore, also estimate a replacement time of the battery 10.

To this end, the BMS 20 includes the battery voltage measurement system 1000 using the transformer relay to be described below to measure voltage of the battery 10 periodically or at a predetermined time set by a user while maintaining insulation between the battery 10 and the BMS 20 and estimate and manage the state information of the battery 10, which includes the SOC, the SOH, the maximum input/output power allowance amount, the output voltage, and the like based on the measured voltage of the battery 10.

The ECU 30 is an electronic control device that controls the state of the electric vehicle 1. For example, the ECU 30 determines a torque degree based on information such as an accelerator, a brake, a speed, and the like and controls an output of the motor 50 according to the torque information.

Further, the ECU 30 transmits a control signal to the inverter 40 so that the battery 10 is charged or discharged based on the state information such as the SOC, the SOH, etc., of the battery 10, which are transferred by the BMS 20.

The inverter 40 allows the battery 10 to be charged or discharged based on the control signal of the ECU 30.

The motor 50 drives the electric vehicle 1 based on control information (e.g., torque information) transferred from the ECU 30 by using electric energy of the battery 10.

FIG. 2 is a block diagram illustrating a configuration of the battery voltage measurement system using the transformer relay according to the embodiment of the present invention and FIG. 3 is a diagram illustrating one example of a detailed configuration of the battery voltage measurement system using the transformer relay according to the embodiment of the present invention.

Referring to FIGS. 2 and 3, the battery voltage measurement system 1000 using the transformer relay may be configured to include a transformer relay 100, a controller 200, and a measurement unit 300. The battery voltage measurement system 1000 illustrated in FIGS. 2 and 3 follows the embodiment and constituent elements thereof are not limited to the embodiment illustrated in FIGS. 2 and 3 and as necessary, the constituent elements may be added, modified, or deleted.

The battery voltage measurement system 1000 according to the embodiment of the present invention may calculate the state of charging (SOC), the state of health (SOH), and the maximum input/output power allowance amount of the battery 10 based on the voltage, current, and a temperature of the battery 10 and is provided in the BMS 20 (of FIG. 1) that controls the charging or discharging of the battery 10 using the calculated state information of the battery 10 to measure the voltage of the battery 10.

The transformer relay 100 according to the embodiment of the present invention may serve to conduct or cut off electrical connection between the battery 10 and the measurement unit 300 according to a voltage measurement signal from the controller 200.

To this end, the transformer relay 100 may be configured to include a transformer 110 and a relay 120.

In more detail, the voltage of the voltage measurement signal received from the controller 200 may be applied to a primary wiring L1 of the transformer 110 and the voltage of the voltage measurement signal transformed according to a wiring ratio of the transformer 110 may be induced to a secondary wiring L2.

Herein, the voltage measurement signal may be a control signal to conduct the electrical connection between the battery 10 and the measurement unit 300 in order to measure the voltage of the battery 10 at a predetermined time.

In this case, the controller 200 may serve to transmit the voltage measurement signal to the transformer 110 and the predetermined time may be set periodically or arbitrarily set by a user or a manager.

Meanwhile, the wiring ratio of the transformer 110 may be 1:1. As a result, the voltage of the voltage measurement signal transformed by the transformer 110 and the voltage of the voltage measurement signal received from the controller 200 may be the same as each other.

That is, as the wiring ratio of the transformer 110 is 1:1, the voltage of the voltage measurement signals before and after transformation are maintained to be the same as each other and the controller 200 and the battery 10 to which the high voltage is applied may be insulated from each other.

The relay 120 receives the voltage of the voltage measurement signal transformed through the transformer 110, and as a result, the operation state of the relay 120 is changed to the On state. Therefore, the relay 120 may serve to conduct the electrical connection between the battery 10 and the measurement unit 300.

In the embodiment, the relay 120 may be a metal oxide silicon field effect transistor (MOSFET) including a gate terminal G, a source terminal S, and a drain terminal D and the gate terminal G, the source terminal S, and the drain terminal D may be connected with a secondary side of the transformer 110, the battery 10, and the measurement unit 300, respectively.

The voltage of the voltage measurement signal induced to the secondary wiring L2 may be input in the gate terminal G. That is, the voltage of the voltage measurement signal transformed through the transformer 110 may be input in the gate terminal G.

In this case, the voltage of the voltage measurement signal input in the gate terminal G may be voltage of threshold voltage of the relay 120 or higher.

As a result, the source terminal S and the drain terminal D are conducted, and as a result, the voltage of the battery 10 input in the source terminal S is output to the drain terminal D to be input in the measurement unit 300.

As described above, the transformer 100 transfers a voltage control signal received from the controller 200 to the relay 120 by using the transformer 110 to insulate the controller 200 and the battery 10 which are vulnerable to the high voltage and high current, thereby protecting the controller 200 and the BMS 20 including the controller 200 from noise.

The measurement unit 300 may serve to measure a battery voltage value charged in the battery 10 by receiving the voltage of the battery 10 output from the relay 120.

Herein, the battery 10 may be a secondary battery in which a plurality of battery cells (not illustrated) are connected in series or in parallel.

As a result, the measurement unit 300 may measure a plurality of battery cell voltage values.

In order to perform the role, the measurement unit 300 may include one or more switch elements, capacitors, a conducting line, and the like.

Meanwhile, the battery voltage value measured through the measurement unit 300 may be transmitted to the BMS 20.

The present invention has been described with reference to the preferred embodiments. However, it will be appreciated by those skilled in the art that various modifications and changes of the present invention can be made without departing from the spirit and the scope of the present invention which are defined in the appended claims and their equivalents.

The invention claimed is:

1. A battery voltage measurement system using a transformer relay, comprising:
    a transformer transforming voltage of a voltage measurement signal according to a wiring ratio of a first wiring and a second wiring;
    a relay transferring voltage of a battery while an operation state is changed to an On state when the transformed voltage of the voltage measurement signal is input; and
    a measurement unit measuring a battery voltage value by receiving the voltage of the battery from the relay,
    wherein the relay is a metal oxide silicon field effect transistor (MOSFET) including a gate terminal, a source terminal, and a drain terminal,
    wherein a secondary side of the transformer is connected to the gate terminal to input the transformed voltage of the voltage measurement signal,
    wherein the battery is connected to the source terminal to input the voltage of the battery, and
    wherein the measurement unit is connected to the drain terminal to output the voltage of the battery input in the source terminal to the measurement unit.

2. The battery voltage measurement system using a transformer relay of claim 1, further comprising:
    a controller transmitting the voltage measurement signal for measuring the voltage of the battery to a primary terminal of the transformer at a predetermined time.

3. The battery voltage measurement system using a transformer relay of claim 1, wherein the wiring ratio is 1:1.

4. A transformer relay comprising:
    a transformer transforming voltage of a voltage measurement signal according to a wiring ratio of a first wiring and a second wiring; and
    a relay transferring voltage of a battery while an operation state is changed to an On state when the transformed voltage of the voltage measurement signal is input,
    wherein the relay is a metal oxide silicon field effect transistor (MOSFET) including a gate terminal, a source terminal, and a drain terminal,
    wherein a secondary side of the transformer is connected to the gate terminal to input the transformed voltage of the voltage measurement signal,
    wherein the battery is connected to the source terminal to input the voltage of the battery, and wherein a measurement unit measuring a battery voltage value is connected to the drain terminal to output the voltage of the battery input in the source terminal to the measurement unit.

5. The transformer relay of claim 4, wherein the transformer receives the voltage measurement signal for measuring the voltage of the battery through a primary terminal thereof at a predetermined time.

6. The transformer relay of claim 4, wherein the wiring ratio is 1:1.

* * * * *